United States Patent
Wang et al.

(10) Patent No.: US 7,675,790 B1
(45) Date of Patent: Mar. 9, 2010

(54) OVER DRIVING PIN FUNCTION SELECTION METHOD AND CIRCUIT

(75) Inventors: Yunsheng Wang, San Jose, CA (US); Tzong-Kwang Yeh, Palo Alto, CA (US); Anthony Zoccali, Carmel Valley, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 55 days.

(21) Appl. No.: 11/239,907

(22) Filed: Sep. 30, 2005

(51) Int. Cl.
  *G11C 7/10* (2006.01)
  *G11C 29/00* (2006.01)
  *G11C 29/50* (2006.01)
  *G11C 29/46* (2006.01)

(52) U.S. Cl. .............. 365/189.03; 365/201; 365/189.07

(58) Field of Classification Search .................. 365/226, 365/201, 189.11, 189.07, 189.03
See application file for complete search history.

(56) References Cited

U.S. PATENT DOCUMENTS

| | | | | |
|---|---|---|---|---|
| 4,229,670 A | * | 10/1980 | Thommen et al. ............ | 327/74 |
| 4,860,259 A | * | 8/1989 | Tobita ......................... | 365/201 |
| 5,051,995 A | * | 9/1991 | Tobita ......................... | 714/718 |
| 5,177,745 A | * | 1/1993 | Rozman ...................... | 714/718 |
| 5,293,491 A | * | 3/1994 | Leung et al. ................. | 710/28 |
| 5,793,775 A | * | 8/1998 | Roohparvar ................. | 714/724 |
| 5,867,421 A | * | 2/1999 | Ho et al. ...................... | 365/149 |
| 6,185,139 B1 | * | 2/2001 | Pantelakis et al. ........... | 365/201 |
| 2004/0062123 A1 | * | 4/2004 | Yumoto ....................... | 365/222 |

* cited by examiner

*Primary Examiner*—J. H. Hur
(74) *Attorney, Agent, or Firm*—Kenneth Glass; Michael R. Hardaway; Glass & Associates

(57) ABSTRACT

A novel method and circuit are disclosed for providing an alternate function to a semiconductor device having a normal operating voltage range and an input pin for receiving an input signal of a voltage level within a normal signal voltage range, for selecting an alternate function, whose steps consist of determining, when a voltage is received at the input pin, whether the voltage is within a normal signal voltage range, enabling the performing of a primary function if the signal voltage is within a normal signal voltage range, and initiating an alternate function when the voltage is outside of the normal signal voltage range.

8 Claims, 4 Drawing Sheets

OVER DRIVING PIN FUNCTION SELECTION METHOD AND CIRCUIT

BACKGROUND OF THE INVENTION

Semiconductor package designs are typically constrained by the functionality of the device itself. The functions of a device determine the number of contacts with the outside environment and the number of contacts determines the number of "pins" required in the final package. However, semiconductor devices in "legacy" applications, meaning applications that have a lifespan extending beyond immediate replacement, sometimes need to evolve with technologies outside the existing application. In other cases, existing technologies cannot be used because of the constraints of legacy packaging.

An example of this is testing technology. Many legacy designs do not include any pins that are dedicated to testing. However, dedicated test pins are common in more recent semiconductor device designs. One testing technology developed by the Joint Test Action Group (JTAG) in the mid-1980s is the boundary-scan standard, described in IEEE 1149.1 since 1990. Boundary scan testing provides robust testing through embedded test circuitry at the chip level to form a complete board-level test protocol. With boundary-scan, complex assemblies can be accessed for in-system device programming and for diagnosing hardware problems. However, JTAG boundary-scan testing requires dedicated on-chip features and a set of dedicated connection pins. Such pins cannot be implemented in a legacy application where packaging constraints determine the number of connection pins available and determine the function of the available connection pins. Designs of devices destined for such legacy applications sometimes forgo in-system testability because of these constraints.

Testability is only one area in which a limited number of connections pins constraints the design of semiconductors. Another example is an increase in memory density within a RAM chip in an existing semiconductor package. Additional memory registers are often unreachable because of the limited number of address pins in the semiconductor package.

Not only do legacy packaging constraints prevent the addition of dedicated pins that can be used to add new functionality, but also, legacy packaging constraints require that pins maintain the dedicated functions specified in the legacy specification. For example each input pin that receives a certain input must still receive the same input, and use the same signal voltage levels as specified in the legacy specification. Accordingly, the dedicated pin functionality of each pin, and the signaling voltage must maintained in the new design.

Accordingly, there is a need for a method and apparatus that will allow for new functions to be implemented in semiconductor devices. Moreover, there is a need for a method an apparatus that meets the above needs and that does not require the use of additional dedicated pins and that maintains the dedicated functions of each pin. Also, there is a need for a method and apparatus that meets the above needs and that allows for testing of a semiconductor device using pins that have a dedicated function that is not a testing-related function. The present invention meets the above needs.

SUMMARY OF THE INVENTION

The present invention provides a method and circuit for providing a new function for a semiconductor device. The method and apparatus of the present invention utilizes existing pins and allows for maintaining the dedicated functionality of existing pins in a legacy design, while providing a new function for the semiconductor device. This allows for updated and upgraded chip designs having additional functionality not originally available, that fit into existing, constrained, packages. Embodiments of the present invention are enabled to provide robust, in-system, in-use, testing of packaged circuits using existing contact pins.

A novel method and circuit are disclosed for providing an alternate function to a semiconductor device having a normal operating voltage range and an input pin for receiving an input signal having a voltage level within a normal signal voltage range. When a voltage is received at the input pin that is within a normal signal voltage range, a primary function is performed. However, when the signal voltage is outside the normal signal voltage range, performance of an alternate function is initiated.

The method and apparatus of the present invention allows for adding functions, without adding dedicated pins for performing the new function. In addition, the present invention allows for maintaining pin assignments, voltage ranges and other criteria of a legacy specification. These and other objects and advantages of the present invention will become obvious to those of ordinary skill in the art after having read the following detailed description of the preferred embodiments which are illustrated in the various drawing figures.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

The present invention provides a method and circuit for initiating an alternative function in the fully-populated footprint of an existing semiconductor device package that provides an alternative functionality to existing pins. The alternative functionality is accessible in both pre-packaged and post-packaged states. Embodiments of the present invention allow updated and upgraded chip designs, with additional functionality not originally available, to fit into existing, constrained, packages.

Subsequently discussed are a novel method and circuit for providing an alternate function to a semiconductor device having a normal operating voltage range and an input pin for receiving an input signal of a voltage level within a normal signal voltage range. When a voltage is received at the input pin, a determination is made as to whether the voltage is within a normal signal voltage range. When the voltage is within the normal signal voltage range a primary function is performed. When the signal voltage is outside of the normal signal voltage range, performance of an alternate function is initiated.

Figure 1:
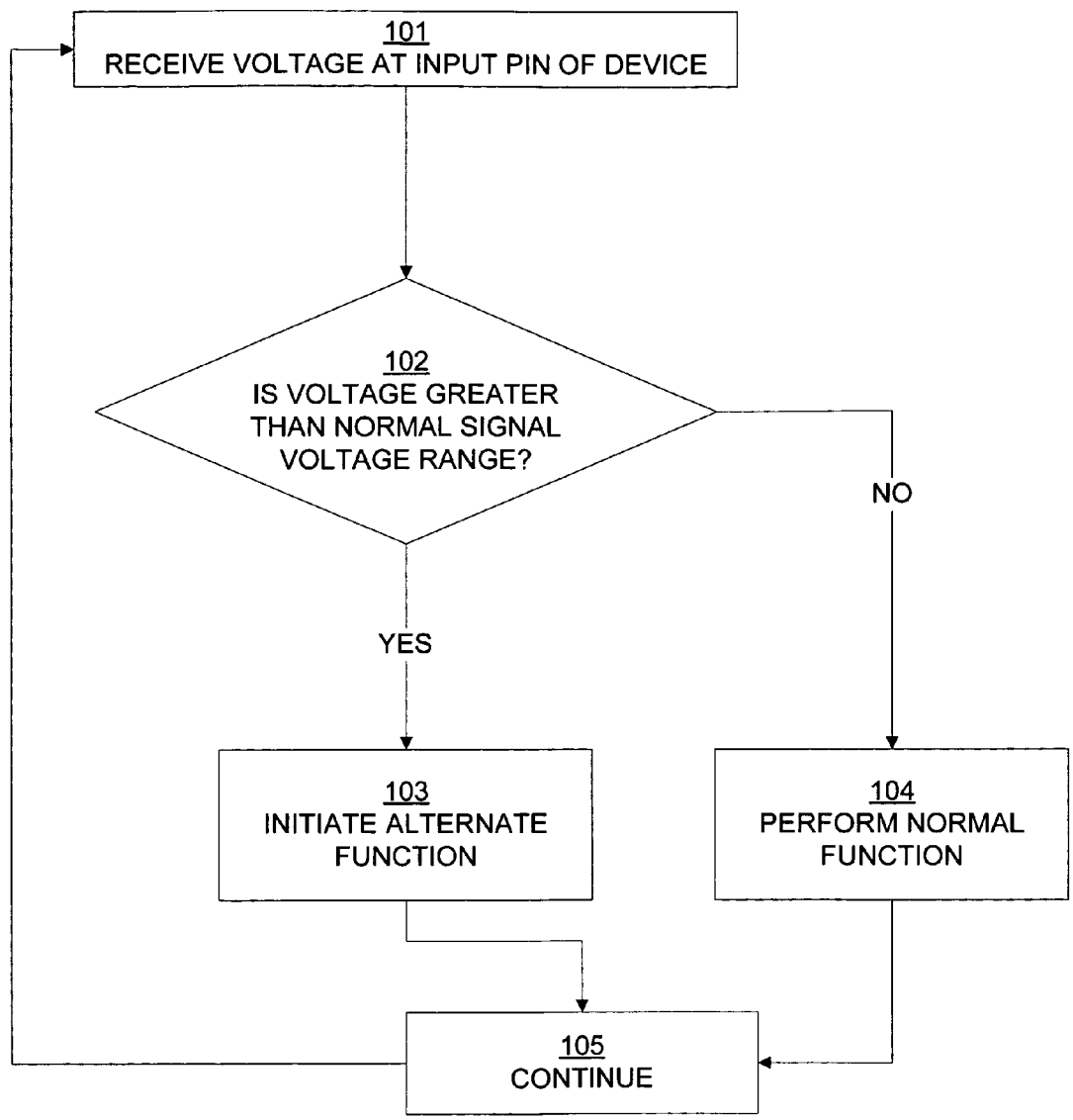
FIG. 1 illustrates a method for initiating an alternative function in an integrated circuit by overdriving an input pin in accordance with an embodiment of the present invention.

FIG. 1 illustrates a method for initiating an alternative function in an integrated circuit in accordance with one embodiment of the present invention. A signal is received 101 at an input pin. It is noted that a signal can be a relatively high voltage or a relatively low voltage and that the relationship of high and low voltages are used as binary "one" and "zero" in digital logic. It is further noted that the actual voltages used to indicate logical high and logical low are of different standards depending on the architecture in which a device is designed to operate. For example, TTL logic uses a normal operating range of 0 to +5 volts. There are also systems that use a 3 volt standard and, increasingly, systems are using 1.8 volt standards. Typically, supply rail voltages in such systems are at the maximum level of the operating range.

At step 102, the voltage of the signal received at the input pin is determined to be either within or outside of a normal signal voltage range. Determination is made, in one embodiment of the present invention, by the use of a comparator circuit that compares the input signal voltage level with supply rail voltage, Vcc. If the signal received at the input pin is at a voltage less than or equal to Vcc but greater than zero, the voltage is considered to be within the normal signal voltage range. If the voltage of the input signal is more than a certain amount greater than Vcc, then the signal voltage is considered to outside of the normal signal voltage range. In one embodiment of the present invention, the margin by which the signal voltage must exceed Vcc in order to be considered outside the normal range is 2 volts.

If, at 102, the input signal voltage is determined to be within the normal signal voltage range, the normal functionality of the input pin and associated circuitry continues 104. For example, if a signal is received that is a logical high but not higher than the high end of the normal signal voltage range, the circuitry receives processes the signal as a logical high.

Resuming at step 102, if the input signal voltage is determined to be outside of the normal signal voltage range, the alternate function is initiated, 103. In one embodiment, the alternate function is a different function from those functions performed by the semiconductor device during normal operation of the semiconductor device, as specified in a legacy design specification, with the alternate function being a function that is not specified in the legacy design specification. In one embodiment of the present invention, the alternate function is a test function.

At 105, this embodiment of the present invention continues to receive signals at the functional signal input pin. In another embodiment, the operation of the signal input pin halts until completion of the alternate function.

In one embodiment the semiconductor device includes a semiconductor chip that is packaged using a package that does not include any dedicated test pins. The input pin that is used for initiating the alternate function will therefore have a function that is not a test function. In the present embodiment the function of each pin on the packaged semiconductor device will maintain its function as specified in the legacy specification. Therefore, the input pin that is used will maintain it's function as specified in the legacy design specification and the semiconductor device will function normally as long as the signal that is received at the input pin of the packaged semiconductor device is within the normal signal voltage range specified in the legacy specification. Accordingly, the method and apparatus of the present invention allows for testing circuitry to be added to the semiconductor device without adding pins dedicated to the added testing circuitry, and while maintaining the initial legacy packaging specification requirements.

Because the package of the present embodiment does not include dedicated test pins, testing programs such as built-in-self-test programs, JTAG tests, and other tests that require dedicated test pins cannot be performed utilizing conventional, prior art testing methods. However, the methods and apparatus of the present invention allow for advanced testing circuitry such as, for example built-in-self-test programs to be added, and allow these programs to be accessed through packaging that does not have dedicated test pins.

Figure 2:
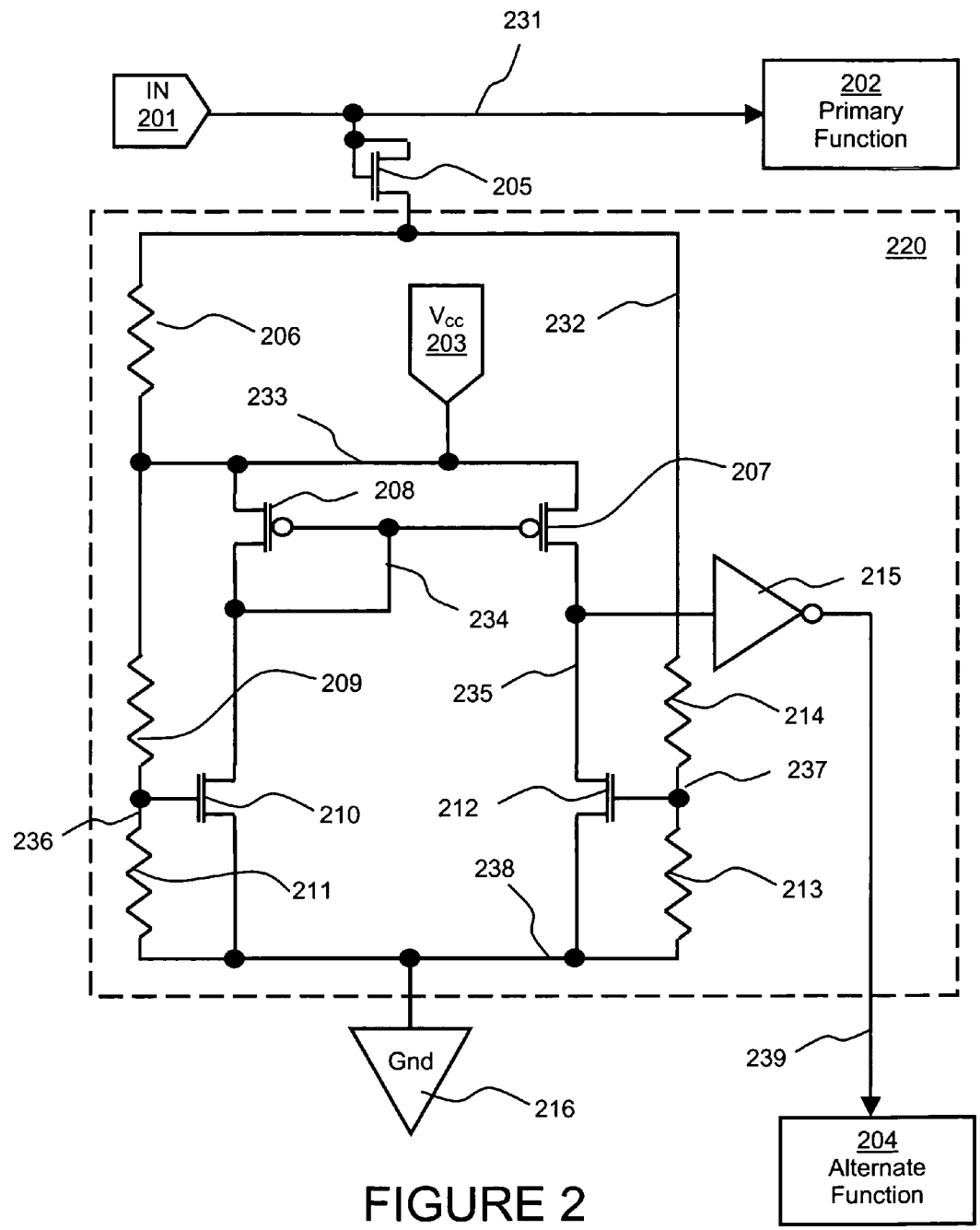
FIG. 2 illustrates an implementation of a comparator circuit in an integrated circuit device for initiating an alternative function for an input pin in an integrated circuit in accordance with an embodiment of the present invention.

FIG. 2 illustrates an implementation of a differential comparator in an integrated circuit device for selecting an alternative function for an input connection. In the present embodiment, the method is implemented in a dual port memory device.

Input pin 201 is a signal input pin of an integrated circuit device. In the present embodiment, the integrated circuit device operates in an architecture of a nominal 3.3 volts. To sense a logically high voltage, therefore, the input pin receives a voltage of more than 2.0 volts and, normally, less than or equal to 3.3 volts. To sense a logically low voltage, then, the input pin receives a voltage of less than 0.8 volts.

It is noted here that the term input pin is used to refer to any method by which an integrated circuit connects to its environment electronically. The term can mean a pin in a chip socket, a lead, a surface-mount solder connection, a solder ball in a ball grid array (BGA), a contact for receiving a solder ball, or any other external connection in a packaged semiconductor device. The term is also used to designate a contact pad in an unpackaged semiconductor device.

Input pin 201 is electronically coupled by node 231 to circuitry within the semiconductor device that performs a primary function 202. Embodiments of the present invention can be implemented in semiconductor devices using any number of functions in normal operations. However, in the embodiment illustrated in FIG. 2, the primary function is a semaphore function in a dual port memory device.

Referring still to FIG. 2, input pin 201 is also electronically connected to MOS device 205 by node 231. MOS device 205 is connected to comparator circuit 220 and is shown with a gate to drain connection. In a gate-to-drain configuration, MOS device 205 is effectuated as a diode. In operation, MOS device 205 acts to isolate input pin 201 and primary function 202 from voltages present at node 232 in the comparator circuit 220.

Comparator circuit 220 is powered by connection to Vcc 203 at node 233. In this embodiment, Vcc is nominally the same voltage as is present in the architectural environment of the exemplary semiconductor device, here 3.3 volts. It is noted that the actual voltage available to power the comparator circuit 220 may be less than 3.3 volts.

In comparator circuit 220, Vcc 203 is connected to the drain connections of PMOS devices 207 and 208 at node 233. PMOS devices 207 and 208 are also connected to each other gate-to-gate at node 234. The source connection of PMOS device 208 is connected to the drain connection of NMOS device 210 at node 234 and the source connection of PMOS device 207 is connected to the drain connection of NMOS device 212 at node 235.

Referring still to FIG. 2, the diode-configured NMOS device 205 is connected to comparator circuit 220 by resistors 206 and 214 which are, in turn, connected to the gates of NMOS device 210 at node 236 and NMOS device 212 at node 237, respectively. Resistor 211 couples the gate of NMOS 210 to ground 216 and resistor 213 connects the gate of NMOS 212 to ground 216, at node 238. The source connections of NMOS devices 210 and 212 are also connected to ground 216 at node 238. The output of comparator circuit 220 is via inverting buffer 215 which initiates alternate, or secondary, function 204 via node 239.

In this embodiment of the present invention, which, again, operates in a nominal 3.3 volt environment, the comparator circuit illustrated in FIG. 2 serves to keep alternate function 204 isolated from input pin 201 during normal operation. When a normal signal-level voltage is sensed on input pin 201 at node 231, primary function 202 employs the logical lows of voltages below 0.8 volts and the logical highs of voltages higher than 2.0 volts.

It is noted here that MOS device 205, because its gate is connected to its drain at node 231, behaves as a diode with its anode connected to node 231 and its cathode connected to node 232 in comparator circuit 220. MOS 205 passes current from node 231 to node 232 in comparator circuit 220 when the voltage at node 231 is higher than that at node 232. Conversely, a voltage at node 231 that is lower than that at node 232 is not passed. In this way, the primary function circuit 202 is not affected by action of the comparator circuit 220. Because Vcc 203 at node 233 is connected by resistor 206 to MOS device 205 via node 232, the voltage at node 232 during normal operation remains at Vcc level, i.e. Vcc is equal to or greater than Vin at node 231.

Accordingly, during normal circuit operation, comparator circuit 220 remains quiescent. The output at node 239 remains low because node 235 remains high. This is because PMOS 207 is conductive because the low gate-source voltage, Vgs, is low, effectively pulling node 235 to Vcc voltage. Node 234 remains low due to the conductive state of NMOS 210 caused by a positive Vgs voltage node 236 allowed by resistor 209.

When a high voltage is received at input pin 201, on the order of 2 volts greater than Vcc, a higher voltage across resistor 214 makes NMOS device 212 conductive. The conductive NMOS device pulls node 235 low, thus generating a logical high at the output of inverting buffer 215. The logical high signal then initiates alternate function 204.

In one embodiment of the present invention, a high-speed 1.8 volt memory device operates in a 3.3 volt environment and is isolated from the higher voltage and powered by a 1.8 volt power supply internal to the semiconductor device. The alternative function is a high voltage test function. In this embodiment, a higher voltage is used to perform robust testing of the lower voltage memory cells. Having the ability to perform such robust testing in-system is a benefit in troubleshooting system problems and in assuring continued quality of the cells. It is noted here that, in the examples of embodiments of the present invention illustrated and discussed here, legacy design constraints prevent the implementation of dedicated testing pins.

Figure 3:
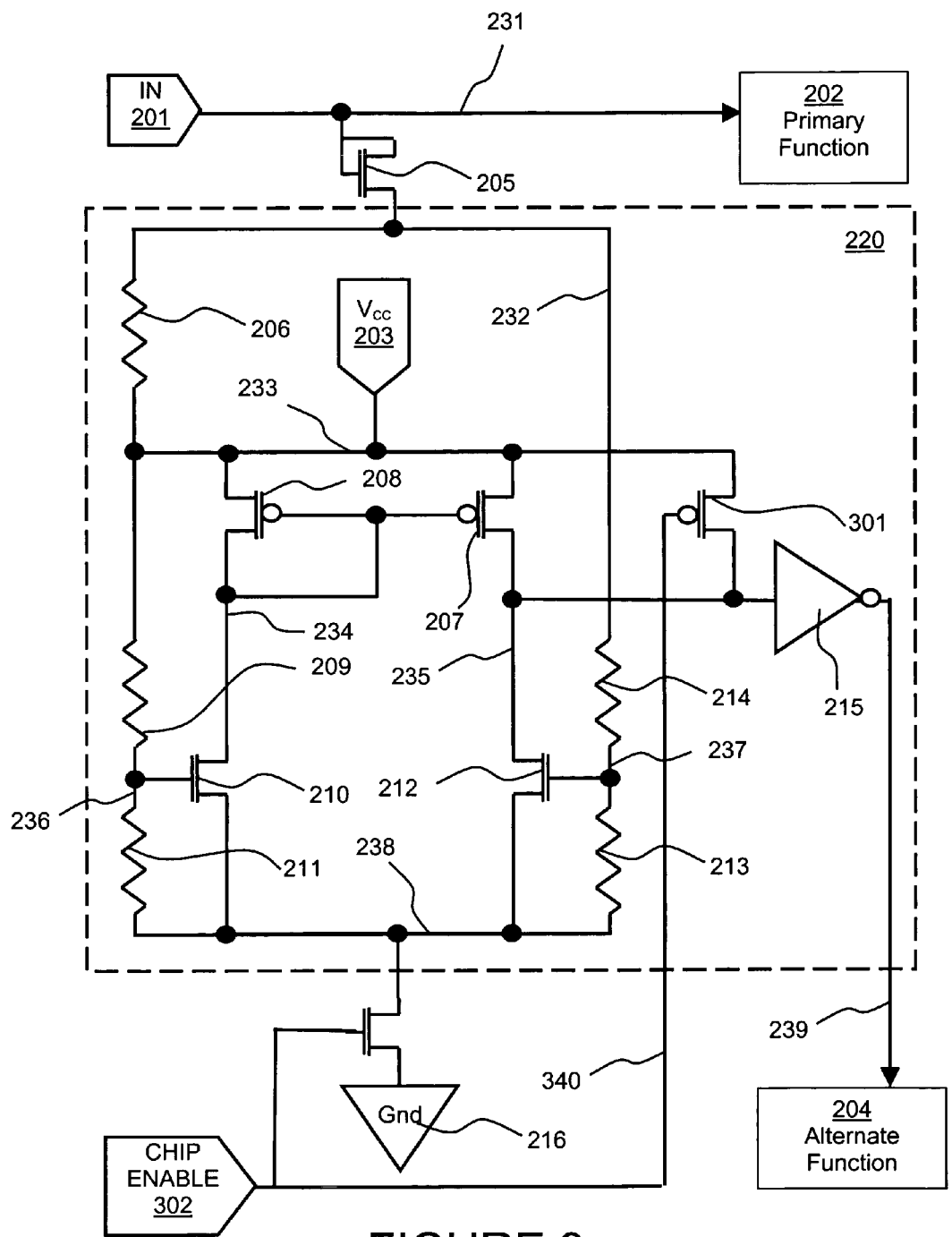
FIG. 3 illustrates an implementation of a comparator circuit with an enable function in an integrated circuit device for selecting an alternative function for an input pin in an integrated circuit in accordance with an embodiment of the present invention.

FIG. 3 illustrates an implementation of an embodiment of the present invention in which a chip-enable signal is employed along with the comparator circuit discussed above as an alternate function select signal. Here, chip enable input pin 302 is connected by node 340 to the gate connection of PMOS device 301. The drain of PMOS 301 is connected to Vcc 203 via node 233 and the source of PMOS 301 is connected to inverting buffer 215 by node 235.

As discussed above, comparator circuit 220 generates a logically high output at node 239 when a voltage is received at input pin 201 that is more than approximately 2 volts above Vcc by pulling node 235 low. With the addition of the functioning of chip enable 302, the output from comparator 220 is prevented from being generated until chip enable 302 is logically high. While chip enable 302, and thus node 340, remains low, PMOS 301 is conductive. This pulls node 235 to Vcc level, suppressing the output of inverting buffer 215. When Chip enable 302 becomes a logical high, PMOS 301 is made non-conductive, allowing node 235 to go low by the action of NMOS 212 and causing a logical high to be output by inverting buffer 215.

Figure 4:
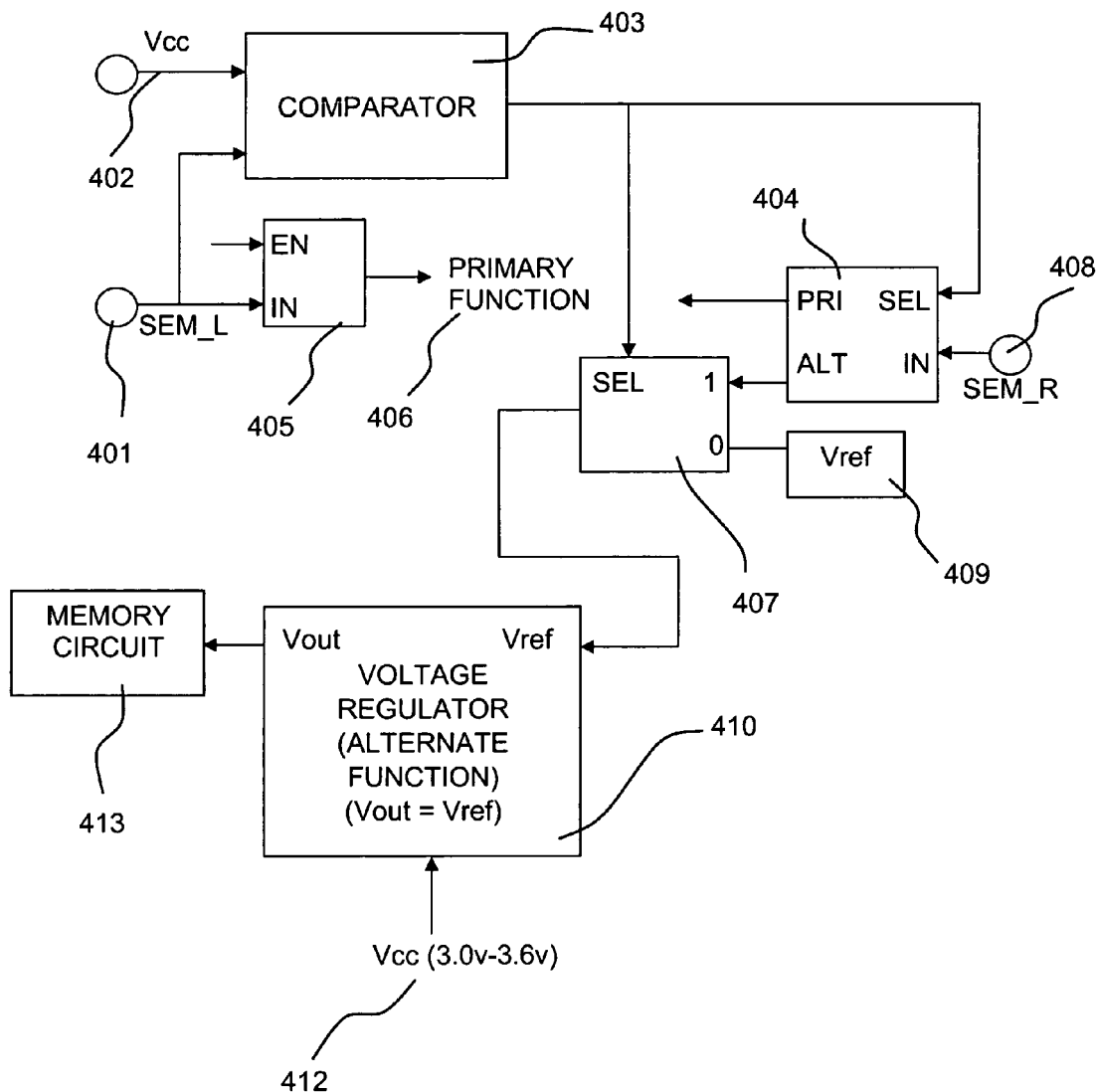
FIG. 4 illustrates an exemplary implementation of a semiconductor device operable to select an alternative function for an input pin in accordance with an embodiment of the present invention.

FIG. 4 illustrates an example of an implementation of a semiconductor device operable to select an alternative function for an input pin of a dual port memory device. The dual-port memory device includes memory circuitry 413 that can be written to, and read from two ports. In order to prevent an attempted write operation from one port while a read operation is occurring via the other port, a semaphore function is implemented that blocks a read of a register while a write to the register is occurring. In the present embodiment, there are two semaphore connection pins that are employed in implementation of an embodiment of the present invention. It is noted that the device used here as an example is an updated device that is constrained to fit in the same footprint of earlier devices and there are no available pins for adding any additional functions. This example device can be referred to as a legacy design.

FIG. 4 is a functional block diagram of the exemplary device. Left semaphore (SEM_L) connection pin 401 receives the semaphore flag signal. the signal, in this embodiment, is a voltage of approximately Vcc level, which in this example is 3.3 volts such that the normal signal voltage range is 0-3.3 volts. The semaphore signal is fed to selection function 405 and to comparator 403. Comparator 403, as discussed earlier, receives both the signal at input pin 401 and Vcc 402. If the signal voltage at input pin 401 is less than or equal to Vcc, the comparator 403 does not generate an enable signal to selection function 404 or selection function 407. When the signal at input pin 401 is greater than Vcc by approximately 2 volts, comparator 403 generates an output signal which is received by selector 404 and selector 407.

When an output is generated by comparator 403 because of the high voltage at input 401, selector 407, which normally passes Vref 409 to voltage regulator 410, instead passes the input signal from selector 404. Selector 404, also switched by the output of the comparator 403, switches the input signal from input pin 408 from its primary function 406 to a secondary function. In this example, the secondary function is electrically connected to voltage regulator 410 which now receives the voltage that is supplied to input pin 408.

In the present embodiment memory circuitry 413 includes high-speed memory cells within the chip that operate at a 1.8 volt standard despite the device being operated in a 3.3 volt architecture. To provide the necessary 1.8 volts to operate the memory cells, the device has an onboard power supply 410. Power supply 410 uses a stable on-board voltage reference to generate 1.8 volts by supplying current at its input voltage level. In normal operation, the input voltage is 1.8 volts, so the output power to memory circuit 413 is also 1.8 volts.

However, it is desirable to test memory cells at voltage levels higher than the operating voltage of the memory cells. The present invention provides a higher test-level voltage, the high voltage can be supplied to input pin 408, semaphore right (SEM_R). Because of the higher, overdriven voltage at semaphore left, input pin 401, the test-level voltage at semaphore right, 408, is directed to voltage regulator 410, which supplies power at the new voltage level to memory circuitry 413.

In one embodiment, a built-in-self-test program that is electrically coupled to the output of comparator 403, is also initiated so as to perform an automated testing routine that utilizes the new voltage level to stress test memory circuitry 413.

Accordingly, the method and apparatus of the present invention allow for a secondary function, in this example a test function, to be implemented in a semiconductor device without adding dedicated test pins that may be barred by legacy design considerations. Also, the functionality and operating characteristics of pins 401, 402 and 408 are maintained, allowing for normal operation in accordance with the legacy design specification.

In the embodiments illustrated in FIGS. 1-4 the normal signal voltage range is the voltage range for signal input, signal output, and is the same as the normal operating voltage range of the semiconductor device. However, it is appreciated that, alternatively the normal signal voltage range could differ from the normal operating voltage range.

Embodiments of the present invention are enabled to provide other functions in other implementations. For example, an alternate function initiated by an embodiment of the present invention can be used to address memory registers which are not reachable using existing dedicated address pins.

Though the embodiments of FIGS. 2-4 provide for added functionality upon receiving a voltage at an input pin that is greater than the normal signal voltage range, alternatively, the comparator could detect voltages that are below the normal signal voltage range (e.g., negative voltages). In this embodiment, when the input signal voltage is determined to be within the normal signal voltage range, the normal functionality of the input pin and associated circuitry continues. However, when the input signal voltage is determined to be below the normal signal voltage range, the alternate function is initiated. In one embodiment of the present invention, the alternate function is a test function.

In yet another embodiment of the present invention, a first alternate function is performed upon receiving a voltage at an input pin that is greater than the normal signal voltage range, and a second alternate function is performed when the input signal voltage is determined to be below the normal signal voltage range, where the first function is different from the second function, and where both the first function and the second function are different from the normal function of the input pin. In this embodiment, when the input signal voltage is determined to be within the normal signal voltage range, the normal functionality of the input pin and associated circuitry continues. In one embodiment of the present invention, the first function and the second function are different test functions.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A packaged semiconductor device that includes a low voltage memory circuit and a plurality of input pins, the input pins not including pins dedicated to a high-voltage stress test function, the packaged semiconductor device comprising:
   an operating voltage input pin for receiving an operating voltage;
   a primary function circuit electronically coupled to the operating voltage input pin, the primary function circuit operating at a normal operating voltage range;
   a secondary function circuit electronically coupled to the operating voltage input pin, the secondary function circuit for performing a high-voltage stress test on the low voltage memory circuit;
   a semaphore signal input pin electronically coupled to the primary function circuit for receiving a signal voltage;
   a comparator circuit electronically coupled to the semaphore signal input pin for comparing the signal voltage to the operating voltage, the comparator circuit enabled to disable the primary function circuit and to cause the secondary function circuit to perform the high-voltage stress test on the low voltage memory circuit as long as the signal voltage is greater than the operating voltage; and
   a voltage regulator electronically coupled to the operating voltage input pin for providing a voltage lower than the operating voltage to the low voltage memory circuit.

2. The packaged semiconductor device described in claim 1, wherein the low voltage memory circuit comprises a plurality of dual-port memory cells.

3. The packaged semiconductor device described in claim 1 wherein the secondary function circuit performs a built-in self test of the memory circuit.

4. The packaged semiconductor device described in claim 1 wherein the signal voltage at the semaphore signal input pin must be at least 2 volts higher that the operating voltage to cause the secondary function circuit to perform the high-voltage stress test on the low voltage memory circuit.

5. The packaged semiconductor device described in claim 1, wherein the operating voltage is a nominal 3.3 volt operating voltage, and wherein the low voltage memory circuit operates on nominally 1.8 volts.

6. For a packaged semiconductor device that includes a package having a fixed number of pins, where none of the pins are dedicated to a test function, the pins including a first semaphore pin that is dedicated to receiving an input signal, the first pin electrically coupled to a first circuit for performing a first function when the input signal is within a normal signal voltage range, a method for adding the test function comprising:
   providing a test function circuit in the packaged semiconductor device that performs a dual port memory circuit high-voltage stress test function; and
   providing a comparator circuit in the packaged semiconductor device that is electrically coupled to the first semaphore pin, electrically coupled to the first circuit and electrically coupled to the dual port memory circuit high-voltage stress test function circuit, the comparator circuit operable to cause the test function circuit to perform the test function instead of causing the first circuit to perform the first function as long as a voltage at the first semaphore pin has a voltage that is greater than the normal signal voltage range.

7. The packaged semiconductor device described in claim 6, wherein the normal signal voltage range is the same as a normal operating voltage range for the packaged semiconductor device, the packaged semiconductor device further comprising memory cells enabled to operate at a voltage that is less than the normal operating voltage range.

8. The packaged semiconductor device described in claim 6, wherein the test function is enabled to test memory cells at a voltage that is greater than a normal operating voltage range.

* * * * *